US012580123B2

(12) United States Patent
Liu et al.

(10) Patent No.: US 12,580,123 B2
(45) Date of Patent: Mar. 17, 2026

(54) ISOLATOR

(71) Applicants: Kabushiki Kaisha Toshiba, Tokyo (JP); Toshiba Electronic Devices & Storage Corporation, Tokyo (JP)

(72) Inventors: Jia Liu, Yokohama Kanagawa (JP); Yusuke Imaizumi, Kawasaki Kanagawa (JP); Yoshinari Tamura, Yokohama Kanagawa (JP); Daijo Chida, Yokohama Kanagawa (JP); Minoru Takizawa, Sagamihara Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 352 days.

(21) Appl. No.: 18/114,085

(22) Filed: Feb. 24, 2023

(65) Prior Publication Data

US 2024/0087802 A1    Mar. 14, 2024

(30) Foreign Application Priority Data

Sep. 13, 2022    (JP) ................................. 2022-145567

(51) Int. Cl.
  *H01F 27/36*        (2006.01)
  *H01F 27/28*        (2006.01)
  (Continued)

(52) U.S. Cl.
  CPC ....... *H01F 27/366* (2020.08); *H01F 27/2804* (2013.01); *H01F 27/327* (2013.01); *H01F 38/14* (2013.01); *H01L 23/552* (2013.01); *H01L 25/16* (2013.01); *H01F 2027/2809* (2013.01); *H01F 27/29* (2013.01); *H01F*

*27/324* (2013.01); *H01F 2038/143* (2013.01); *H01L 23/49575* (2013.01); *H01L 24/48* (2013.01); *H01L 24/49* (2013.01);
(Continued)

(58) Field of Classification Search
None
See application file for complete search history.

(56) References Cited

U.S. PATENT DOCUMENTS

| | | | |
|---|---|---|---|
| 5,420,558 A | 5/1995 | Naoki et al. | |
| 5,525,941 A | 6/1996 | Roshen et al. | |

(Continued)

FOREIGN PATENT DOCUMENTS

| | | |
|---|---|---|
| JP | H03-097386 U | 10/1991 |
| JP | H06-120048 A | 4/1994 |

(Continued)

OTHER PUBLICATIONS

Japanese Office Action mailed Jul. 8, 2025 in corresponding Japanese Patent Application 2022-145567 with English Translation, 12 pages.

*Primary Examiner* — Michelle Mandala
(74) *Attorney, Agent, or Firm* — Kim & Stewart LLP

(57) ABSTRACT

According to one embodiment, an isolator includes: an isolator module including a first coil and a second coil that are separated with respect to a first direction and face each other; a magnetic member provided on the isolator module in such a manner that the magnetic member overlaps the first coil and the second coil when viewed in the first direction; and an insulating member covering the isolator module and the magnetic member.

12 Claims, 5 Drawing Sheets

(51) Int. Cl.

| | | |
|---|---|---|
| *H01F 27/32* | (2006.01) |
| *H01F 38/14* | (2006.01) |
| *H01L 23/00* | (2006.01) |
| *H01L 23/552* | (2006.01) |
| *H01L 25/16* | (2023.01) |
| *H01F 27/29* | (2006.01) |
| *H01L 23/495* | (2006.01) |

(52) U.S. Cl.

CPC ............... *H01L 2224/48091* (2013.01); *H01L 2224/48106* (2013.01); *H01L 2224/48195* (2013.01); *H01L 2224/48245* (2013.01); *H01L 2224/49175* (2013.01); *H01L 2924/19042* (2013.01); *H01L 2924/19105* (2013.01)

(56) References Cited

U.S. PATENT DOCUMENTS

| | | | |
|---|---|---|---|
| 9,318,784 | B2 | 4/2016 | Sin et al. |
| 9,761,545 | B2 | 9/2017 | Sin et al. |
| 10,497,506 | B2* | 12/2019 | Massolini ............... H01F 41/04 |
| 2001/0035579 | A1 | 11/2001 | Yoshida |
| 2006/0180342 | A1 | 8/2006 | Takaya |
| 2015/0137314 | A1 | 5/2015 | Osada |
| 2016/0164483 | A1* | 6/2016 | Park ....................... H03H 7/427 |
| | | | 333/185 |
| 2017/0178787 | A1* | 6/2017 | Massolini ............. H01F 27/288 |
| 2019/0109233 | A1 | 4/2019 | Tellkamp |
| 2020/0211939 | A1 | 7/2020 | Khanolkar |
| 2021/0375525 | A1 | 12/2021 | Kao |
| 2023/0005652 | A1* | 1/2023 | Hou ........................ H01F 27/06 |
| 2023/0309228 | A1 | 9/2023 | Imaizumi et al. |

FOREIGN PATENT DOCUMENTS

| | | |
|---|---|---|
| JP | H07-014714 A | 1/1995 |
| JP | 2000-058341 A | 2/2000 |
| JP | 2000-082621 A | 3/2000 |
| JP | 2001-284498 A | 10/2001 |
| JP | 2003-324020 A | 11/2003 |
| JP | 2009-141271 A | 6/2009 |
| JP | 2011-147011 A | 7/2011 |
| JP | 2012-182740 A | 9/2012 |
| JP | 2014-522561 A | 9/2014 |
| JP | 2016-028407 A | 2/2016 |
| JP | 2017-017175 A | 1/2017 |
| JP | 2017-538277 A | 12/2017 |
| JP | 2022-517550 A | 3/2022 |
| JP | 2023-141929 A | 10/2023 |
| WO | 2021257934 A1 | 12/2021 |
| WO | 2022212305 A1 | 10/2022 |

* cited by examiner

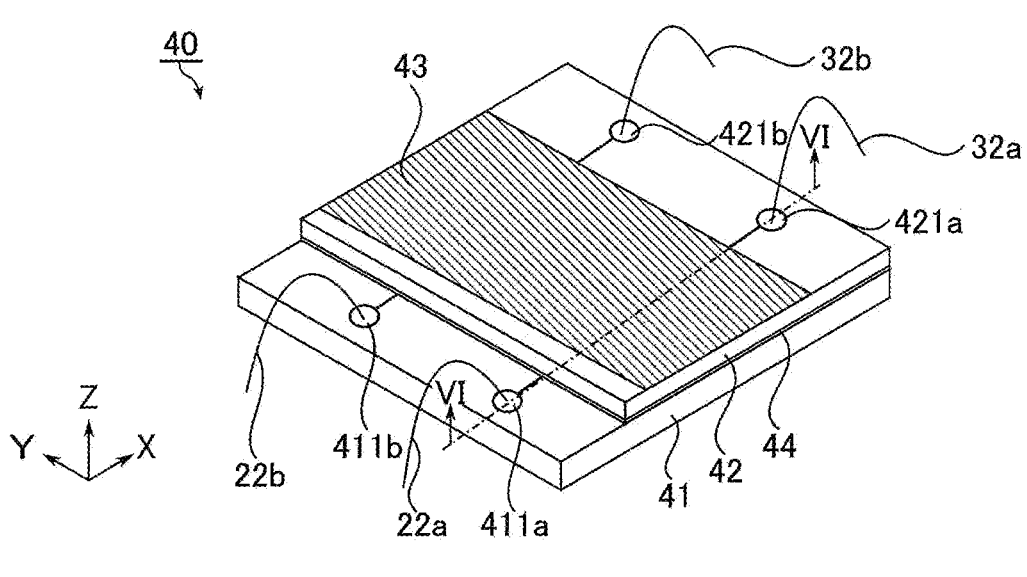
F I G. 3
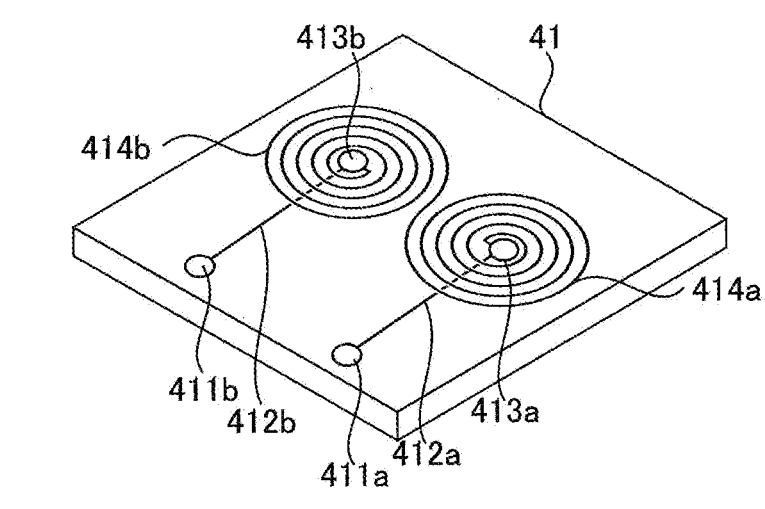
F I G. 4
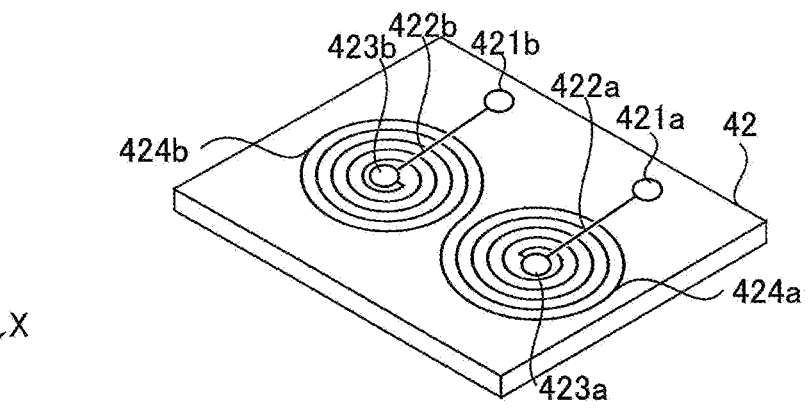
F I G. 5

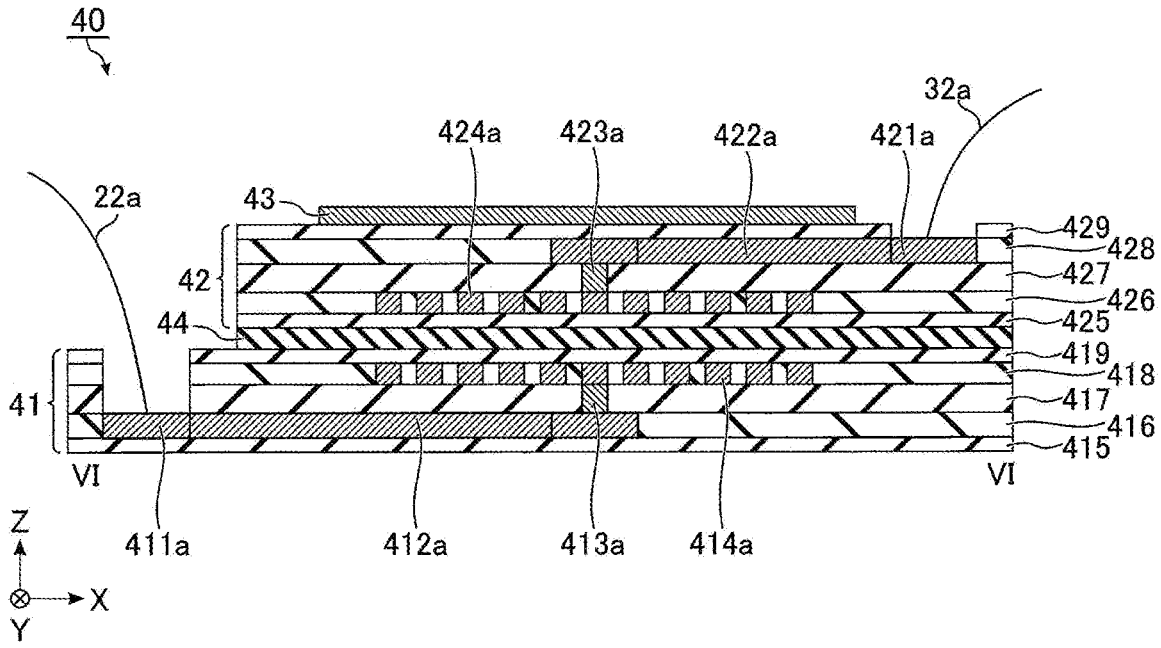
F I G. 6
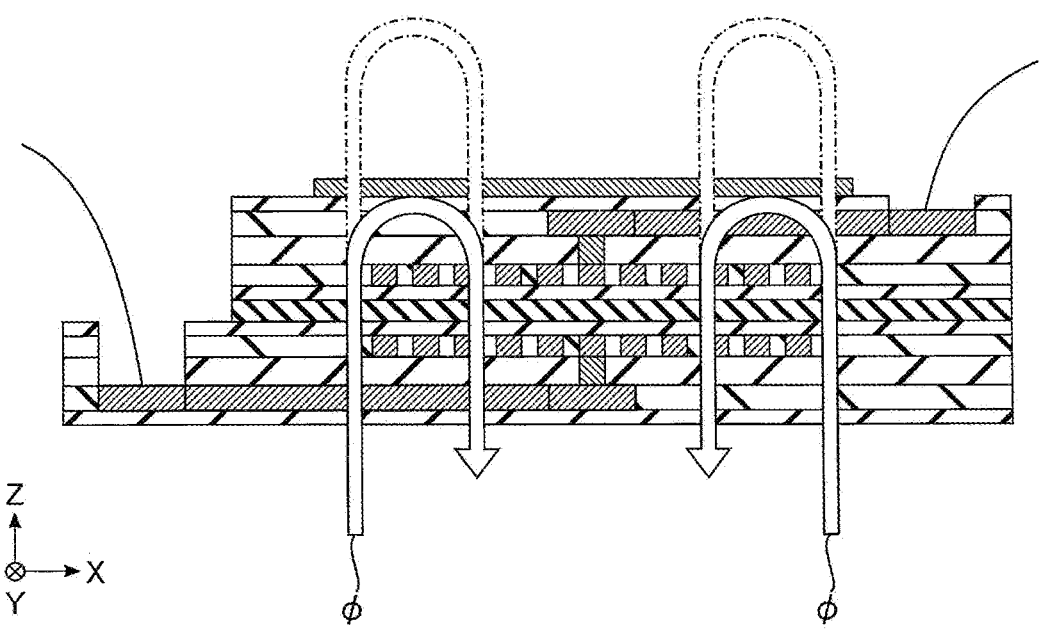
F I G. 7

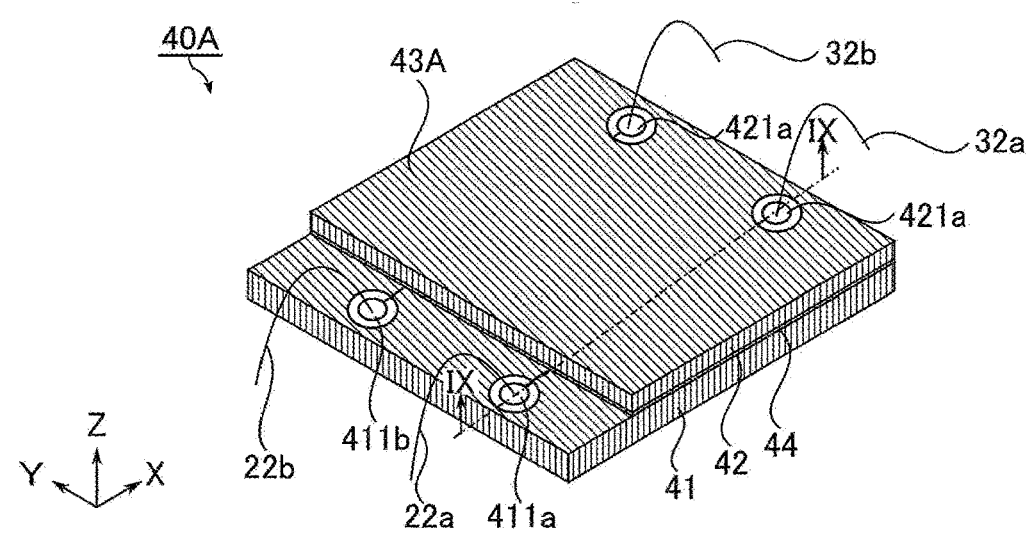
F I G. 8
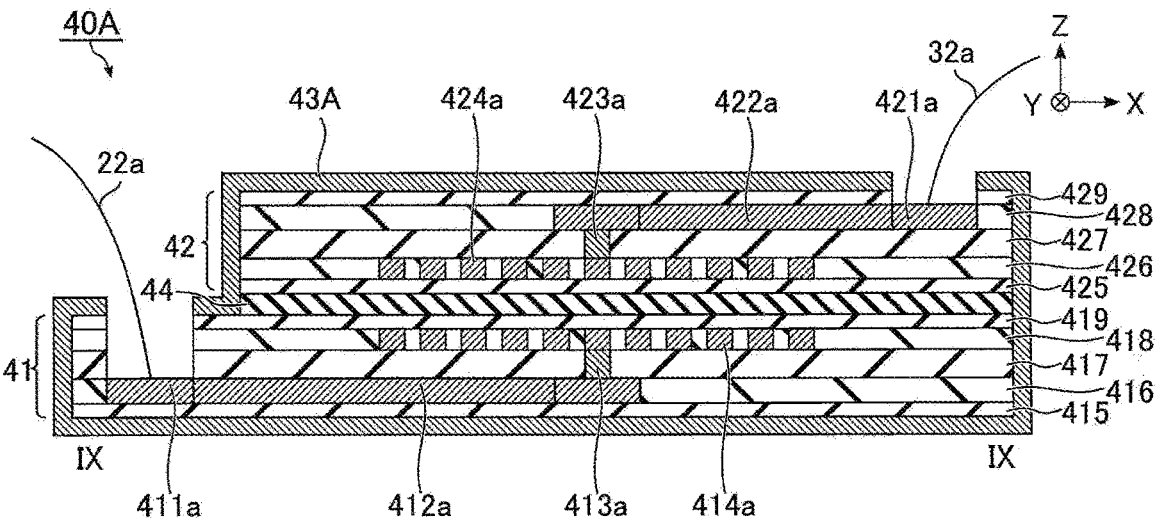
F I G. 9
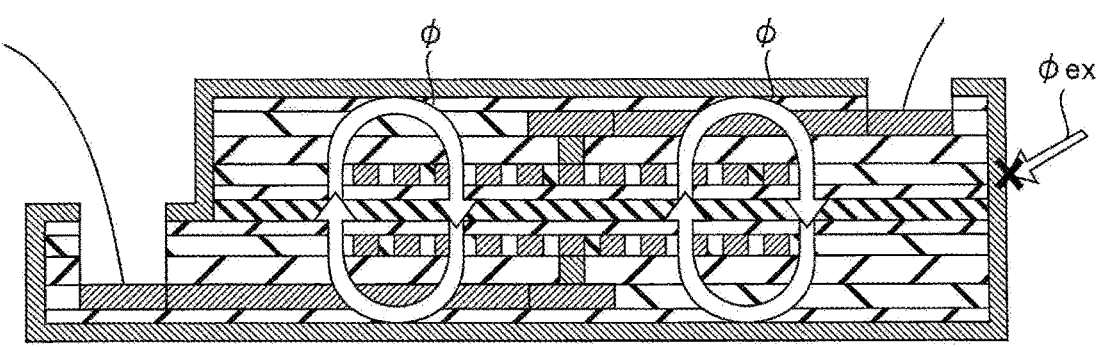
F I G. 10

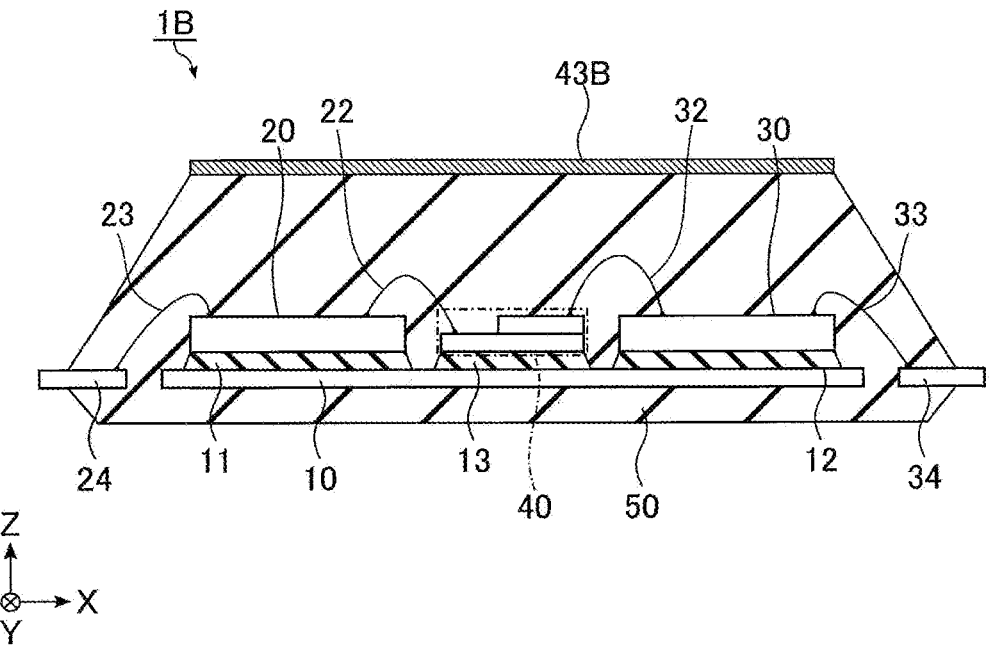
F I G. 11
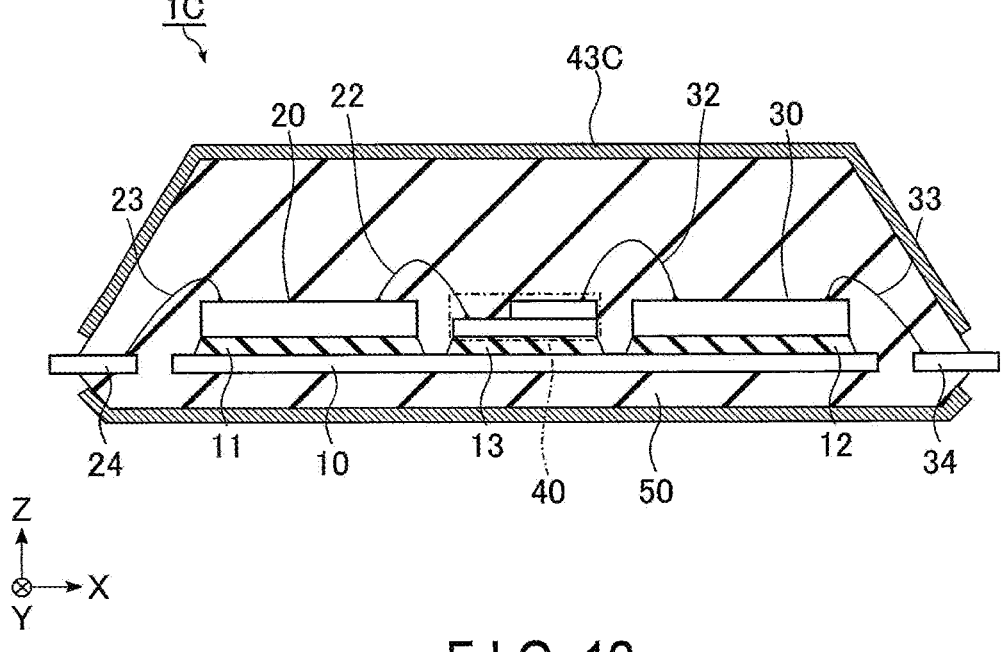
F I G. 12

ISOLATOR

CROSS-REFERENCE TO RELATED APPLICATIONS

This application is based upon and claims the benefit of priority from Japanese Patent Application No. 2022-145567, filed Sep. 13, 2022, the entire contents of which are incorporated herein by reference.

FIELD

Embodiments described herein relate generally to an isolator.

BACKGROUND

An isolator that transmits signals from a transmit circuit to a receive circuit, with the circuits being insulated from each other, is known.

BRIEF DESCRIPTION OF THE DRAWINGS

FIG. 3 is a perspective view illustrating an example of a structure of an isolator module according to the first embodiment.

FIG. 4 is a perspective view illustrating an example of a structure of a primary circuit included in the isolator module according to the first embodiment.

FIG. 5 is a perspective view illustrating an example of a structure of a secondary circuit included in the isolator module according to the first embodiment.

FIG. 6 is a cross-sectional view taken along line VI-VI in FIG. 3, illustrating an example of a cross-sectional structure of the isolator module according to the first embodiment.

FIG. 7 is a diagram showing an example of a magnetic flux caused in the isolator module of the first embodiment.

FIG. 8 is a perspective view illustrating an example of a structure of an isolator module according to a second embodiment.

FIG. 9 is a cross-sectional view taken along line IX-IX in FIG. 8, illustrating an example of a cross-sectional structure of the isolator module according to the second embodiment.

FIG. 10 is a diagram showing an example of a magnetic flux caused in the isolator module of the second embodiment.

FIG. 11 is a cross-sectional view, illustrating an example of a cross-sectional structure of an isolator package according to a third embodiment.

FIG. 12 is a cross-sectional view, illustrating an example of a cross-sectional structure of an isolator package according to a fourth embodiment.

DETAILED DESCRIPTION

Figure 1:
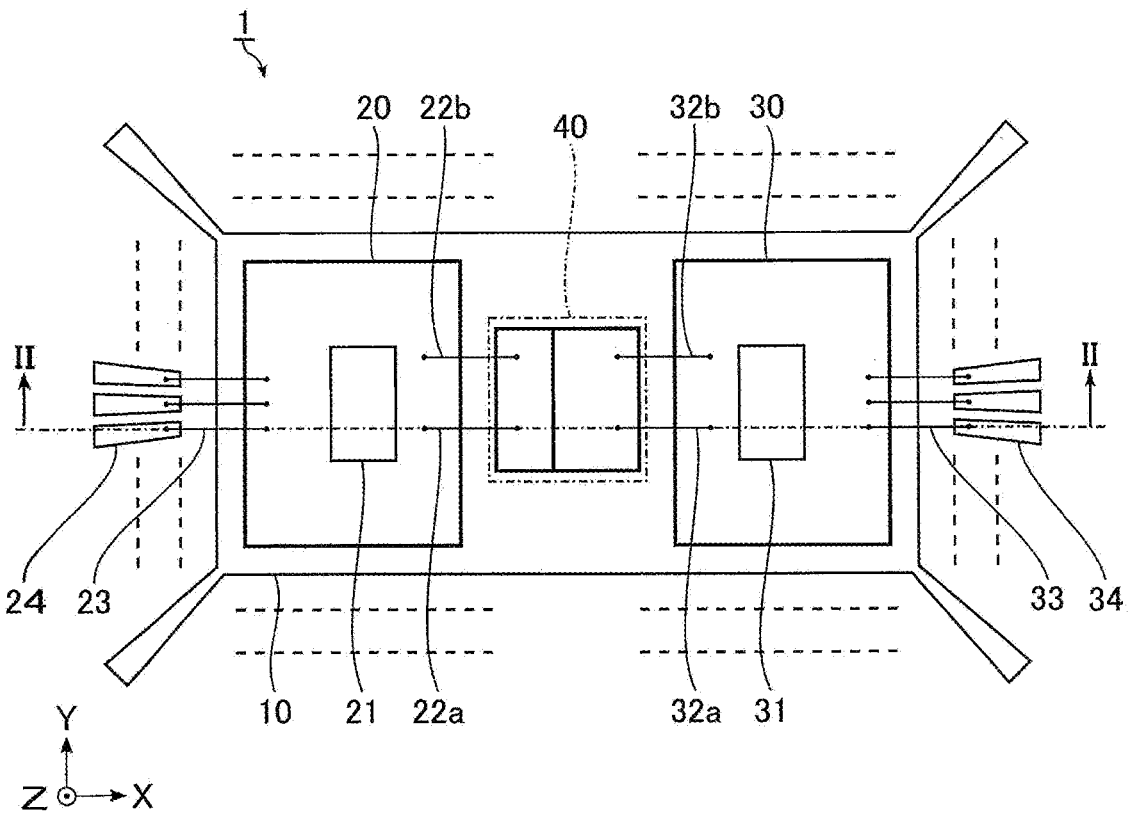
FIG. 1 is a plan view illustrating an example of a planar layout of an isolator package according to a first embodiment.

In general, according to one embodiment, an isolator includes: an isolator module including a first coil and a second coil that are separated with respect to a first direction and face each other; a magnetic member provided on the isolator module in such a manner that the magnetic member overlaps the first coil and the second coil when viewed in the first direction; and an insulating member covering the isolator module and the magnetic member.

The embodiments will now be described with reference to the drawings. The dimensions, scales, etc., used in the drawings are not binding on actual products.

The description will use the same reference signs for the components having the same or substantially the same functions and configurations. For the purpose of distinguishing between components having the same or substantially the same configurations, the description may add different characters or numerals after their respective reference signs.

1. First Embodiment

An isolator according to the first embodiment is described.

Figure 2:
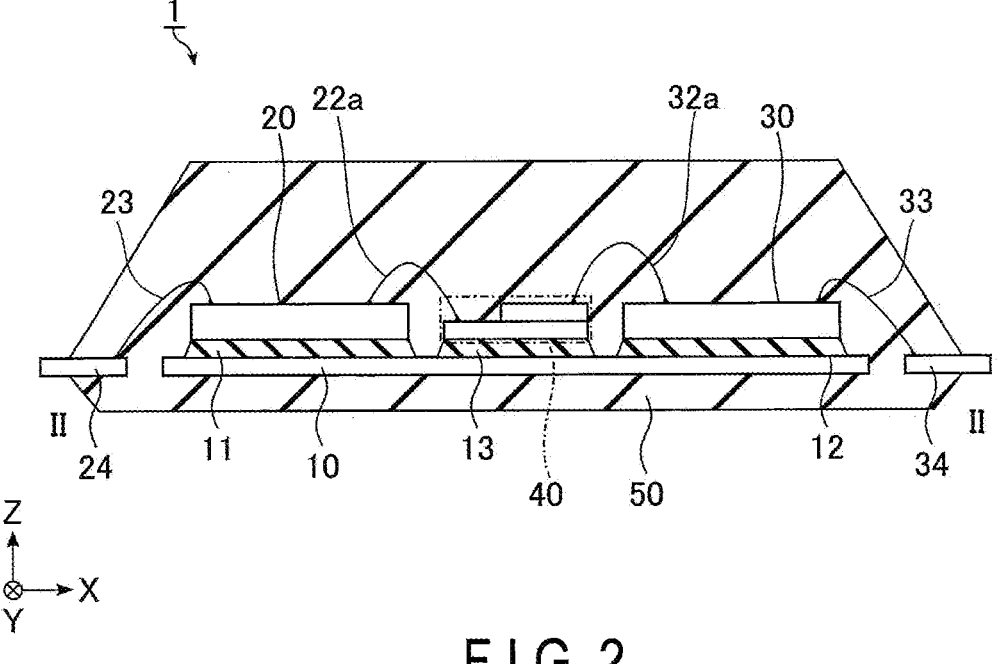
FIG. 2 is a cross-sectional view taken along line II-II in FIG. 1, illustrating an example of a cross-sectional structure of the isolator package according to the first embodiment.

FIG. 1 is a plan view illustrating an example of a planar layout of an isolator package according to the first embodiment. FIG. 2 is a cross-sectional view taken along line II-II in FIG. 1, illustrating an example of a cross-sectional structure of the isolator package according to the first embodiment. As shown in FIGS. 1 and 2, the isolator package 1 is a package that includes a digital isolator. The isolator package 1 comprises a frame 10, semiconductor chips 20 and 30, an isolator module 40, and an insulating member 50. In FIG. 1, the insulating member 50 is omitted.

The frame 10 is a metal member having a plate-like shape. On the plane of the frame 10, the semiconductor chips 20 and 30 and the isolator module 40 are provided with insulating adhesive members 11, 12, and 13 being interposed therebetween. The frame 10 functions as a substrate that supports the semiconductor chips 20 and 30 and the isolator module 40.

Hereinafter, the plane parallel to the plane of the frame 10 will be referred to as an X-Y plane. The directions orthogonally intersecting with each other in the X-Y plane will be referred to as the X-direction and the Y-direction. The direction intersecting the X-Y plane will be referred to as the Z-direction. In the Z-direction, the direction from the frame 10 toward the semiconductor chips 20 and 30 and the isolator module 40 may be called an "upward direction".

A circuit 21 is formed in the semiconductor chip 20. The circuit 21 includes a signal transmit and receive circuit and a signal modulation and demodulation circuit. The circuit 21 of the semiconductor chip 20 is electrically coupled to the isolator module 40 via the bonding wires 22a and 22b. The semiconductor chip 20 is electrically coupled to the pin 24 via the bonding wire 23.

The semiconductor chip 30 is aligned with the semiconductor chip 20 in the X-direction. A circuit 31 is formed in the semiconductor chip 30. The circuit 31 includes a signal transmit and receive circuit and a signal modulation and demodulation circuit. The circuit 31 of the semiconductor chip 30 is electrically coupled to the isolator module 40 via the bonding wires 32a and 32b. The semiconductor chip 30 is electrically coupled to the pin 34 via the bonding wire 33.

The isolator module 40 is a module functioning as a digital isolator. The isolator module 40 is provided between the semiconductor chip 20 and the semiconductor chip 30. A transformer is implemented in the isolator module 40. The isolator module 40 is configured to, with a use of a transformer, transmit signals between the transmit circuit (primary circuit) and the receive circuit (secondary circuit), with the circuits being insulated. The details of the configuration of the isolator module 40 will be described later.

The insulating member 50 includes an electrically insulative resin, for example. The insulating member 50 seals the frame 10, the semiconductor chips 20 and 30, the isolator module 40, and the bonding wires 22a, 22b, 23, 32a, 32b, and 33. The pins 24 and 34 are stationarily fixed by the insulating member 50 and have a part exposed from the insulating member 50.

With the above-described configuration, the isolator package 1 can transmit signals between the pin 24 and the pin 34, via the isolator module 40.

FIG. 3 is a perspective view illustrating an example of a structure of the isolator module according to the first embodiment. FIG. 4 is a perspective view illustrating an example of a structure of a primary circuit included in the isolator module according to the first embodiment. FIG. 5 is a perspective view illustrating an example of a structure of a secondary circuit included in the isolator module according to the first embodiment. FIG. 6 is a cross-sectional view taken along line VI-VI in FIG. 3, illustrating an example of a cross-sectional structure of the isolator module according to the first embodiment. As shown in FIGS. 3, 4, 5, and 6, the isolator module 40 is constituted by, for example, wiring boards 41 and 42, a magnetic member 43, and an insulating layer 44. FIGS. 3, 4, and 5 show the conductive members in the wiring boards 41 and 42 transparently, without the insulating member that covers the conductive members.

The wiring board 41 is a printed circuit board corresponding to the primary circuit. A flexible printed circuit (FPC) board having a flexibility may be used as a printed circuit board. The shape of the wiring board may be rectangular but is not limited thereto, and any arbitrarily determined shape may be applied. In the wiring board 41, conductive pads 411a and 411b, wiring layers 412a and 412b, vias 413a and 413b, and the coils 414a and 414b are provided. The outer shape of the wiring board 41 is formed by laminating the insulating layers 415, 416, 417, 418, and 419 in this order.

The pads 411a and 411b are provided within the insulating layer 416. Of the insulating layers 417, 418, and 419 above the insulating layer 416, the parts overlapping the pads 411a and 411b when viewed in the Z direction are removed. Thus, the bonding wires 22a and 22b are electrically coupled to the pads 411a and 411b, respectively.

The wiring layers 412a and 412b are provided within the insulating layer 416. The wiring layer 412a couples the pad 411a to the lower end of the via 413a, and the wiring layer 412b couples the pad 411b to the lower end of the via 413b.

The vias 413a and 413b extend in the Z direction, penetrating the insulating layer 417. The upper end of the via 413a and the upper end of the via 413b are electrically coupled to the coils 414a and 414b, respectively.

The coils 414a and 414b are provided within the insulating layer 418. When viewed in the Z direction, each of the coils 414a and 414b has a spirally wound shape and has a predetermined inductance. Each of the coils 414a and 414b has a central end and an outer periphery end. The central end of the coil 414a and the central end of the coil 414b are electrically coupled to the upper end of the via 413a and the upper end of the via 413b, respectively. The outer periphery end of the coil 414a and the outer periphery end of the coil 414b are electrically coupled.

An electric path is thus formed between the bonding wire 22a and the bonding wire 22b. The coils 414a and 414b may be called a "primary coil".

An insulating layer 44 is provided on the upper surface of the insulating layer 419 of the wiring board 41. The insulating layer 44 contains, for example, an insulative silicon paste material. The insulating layer 44 separates and insulates the wiring board 41 and the wiring board 42 from each other.

A wiring board 42 is provided on the upper surface of the insulating layer 44. The wiring board 42 is a printed circuit board corresponding to a secondary circuit. As the printed circuit board, a flexible printed circuit board having flexibility may be used, for example. The shape of the wiring board 42 may be rectangular but not limited thereto, and any arbitrarily determined shape may be applied. The area size of the wiring board 42 when viewed in the Z direction is smaller than the area size of the wiring board 41, for example. The interference between the bonding wires 22a and 22b and the wiring board 42 can be suppressed by providing the pads 411a and 411b in an area of the wiring board 41 that does not overlap with the wiring board 42 when viewed in the Z direction.

In the wiring board 42, conductive pads 421a and 421b, wiring layers 422a and 422b, vias 423a and 423b, and the coils 424a and 424b are provided. The outer shape of the wiring board 42 is formed by laminating the insulating layers 425, 426, 427, 428, and 429 in this order. In other words, the insulating layer 425 of the wiring board 42 is provided on the upper surface of the insulating layer 44.

The pads 421a and 421b are provided within the insulating layer 428. Of the insulating layer 429 above the insulating layer 428, the parts overlapping the pads 421a and 421b when viewed in the Z direction are removed. Thus, the bonding wires 32a and 32b are electrically coupled to the pads 421a and 421b, respectively.

The wiring layers 422a and 422b are provided within the insulating layer 428. The wiring layer 422a couples the pad 421a to the upper end of the via 423a, and the wiring layer 422b couples the pad 421b to the upper end of the via 423b.

The vias 423a and 423b extend in the Z direction, penetrating the insulating layer 427. The lower end of the via 423a and the lower end of the via 423b are electrically coupled to the coils 424a and 424b, respectively.

The coils 424a and 424b are provided within the insulating layer 426. When viewed in the Z direction, each of the coils 424a and 424b has a spirally wound shape and has a predetermined inductance. Each of the coils 424a and 424b has a central end and an outer periphery end. The central end of the coil 424a and the central end of the coil 424b are electrically coupled to the lower end of the via 423a and the lower end of the via 423b, respectively. The outer periphery end of the coil 424a and the outer periphery end of the coil 424b are electrically coupled.

An electric path is thus formed between the bonding wire 32a and the bonding wire 32b. The coils 424a and 424b may be called a "secondary coil".

The primary coil and the secondary coil are aligned with each other, being separated from and facing each other with respect to the Z direction. The primary coil and the secondary coil function as a transformer.

A magnetic member 43 is provided on the upper surface of the insulating layer 429 of the wiring board 42. The magnetic member 43 is a plate-shaped member having magnetic properties. As the magnetic member 43, a ferrite sheet may be used, for example. The magnetic member 43 is provided in such a manner that it overlaps the primary coil and the secondary coil, when viewed in the Z direction. The magnetic member 43 may be provided across the upper surface of the wiring board 42, unless it does not contact with the pads 421a and 421b and the bonding wires 32a and 32b.

According to the first embodiment, the magnetic member 43 is provided on the upper surface of the insulating layer 429 of the isolator module 40, in such a manner that the magnetic member overlaps the primary coil and the secondary coil in the isolator module 40 when viewed in the Z direction. It is thereby possible to prevent a magnetic flux generated when signals are transmitted and received via the isolator module 40 from extending beyond the magnetic member 43 and to the outside of the isolator module 40. Hereinafter, the description is given with reference to FIG. 7.

FIG. 7 shows an example of a magnetic flux generated in the isolator of the first embodiment. In FIG. 7, the magnetic flux φ generated in the isolator module 40 in each of the cases where the magnetic member 43 is provided and not provided is indicated by a solid arrow and an alternate long and short dashed line arrow, respectively.

If no magnetic member 43 is provided, the magnetic flux φ is formed under no significant restrictions at the boundary between the inside and the outside of the isolator module 40. In particular, the magnetic flux φ is formed in a direction along which the primary coil and the secondary coil are aligned. For this reason, the rotation loop of the magnetic flux φ may reach outside the isolator module 40 at both ends along the Z direction.

According to the first embodiment, the magnetic member 43 cuts off the magnetic flux φ on the upper surface of the isolator module 40. Thus, a rotation loop of the magnetic flux φ is formed in such a manner that the loop is folded at the magnetic member 43. For this reason, the loop does not reach at least the outside of the upper end of the isolator module 40 and the magnetic flux φ can be converged. In other words, of the magnetic flux φ generated in the isolator module 40, a leakage flux that does not contribute to a transformer can be reduced. It is thus possible to improve a coupling coefficient of a transformer.

2. Second Embodiment

Next, an isolator according to the second embodiment is described. The second embodiment differs from the first embodiment in that a magnetic member is provided to a surface in addition to the upper surface of the isolator module. Hereinafter, only the matters different from the first embodiment are described. Descriptions of configurations similar to those of the first embodiment are omitted.

FIG. 8 is a perspective view illustrating an example of a structure of the isolator module according to the second embodiment. FIG. 9 is a cross-sectional view taken along line IX-IX in FIG. 8, illustrating an example of a cross-sectional structure of the isolator module according to the second embodiment. FIGS. 8 and 9 correspond to FIGS. 3 and 6 in the first embodiment.

As shown in FIGS. 8 and 9, the isolator module 40A is constituted by, for example, wiring boards 41 and 42, a magnetic member 43A, and an insulating layer 44. Since the configurations of the wiring boards 41 and 42 and the insulating layer 44 are the same as those in the first embodiment, description thereof is omitted.

The magnetic member 43A is a plate-shaped member having magnetic properties. As the magnetic member 43A, a ferrite sheet may be used, for example. The magnetic member 43A is provided so as to cover the upper, side, and lower surfaces of a structure constituted by the wiring boards 41 and 42 and the insulating layer 44. Specifically, the magnetic member 43A may be provided over the upper, side, and lower surfaces of the structure constituted by the wiring board 41 and 42 and the insulating layer 44, unless it does not contact with the pads 411*a*, 411*b*, 421*a*, and 421*b* and the bonding wires 32*a* and 32*b*.

The magnetic member 43A may be a single continuous sheet or multiple sheets bonded together. As shown in the example of FIGS. 8 and 9, it is desirable for the magnetic member 43A to completely cover a structure constituted by the wiring boards 41 and 42 and the insulating layer 44, except for the area that may interfere with the pads 411*a*, 411*b*, 421*a*, and 421*b* and the bonding wires 22*a*, 22*b*, 32*a*, and 32*b*; however, the structure of the magnetic member 43A is not limited to this example. For example, in the case where the magnetic member 43A is made of multiple sheets bonded together, there may be a gap between these sheets. Furthermore, the magnetic member 43A is not necessarily provided on all surfaces of the structure constituted by the wiring boards 41 and 42 and the insulating layer 44. For example, the magnetic member 43A may be provided on at least one of the lower surface or the side surface in addition to the upper surface of the structure constituted by the wiring boards 41 and 42 and the insulating layer 44.

According to the second embodiment, the magnetic member 43A is provided so as to cover each surface of the isolator module 40A. It is thus possible to improve a coupling coefficient of a transformer. Hereinafter, the description is given with reference to FIG. 10.

FIG. 10 shows an example of a magnetic flux generated in the isolator of the second embodiment. FIG. 10 corresponds to FIG. 7 to which reference was made in the first embodiment. FIG. 10 shows a magnetic flux φ generated in the isolator module 40A and an external magnetic flux φex generated outside the isolator module 40A.

With the magnetic member 43A being provided, the magnetic flux φ is interrupted by the magnetic member 43A on multiple interfaces between the inside and the outside of the isolator module 40A. It is thereby possible to increase convergence of the magnetic flux cp. Particularly, in the case where the magnetic member 43A is provided in the upper surface and the lower surface of the isolator module 40A, it is substantially possible for the magnetic member 43A to cause the magnetic flux φ to loop within the isolator module 40A. It is thus possible to improve a coupling coefficient of the transformer.

Furthermore, the magnetic member 43A can interrupt the external magnetic flux φex that flows from the outside of the isolator module 40A into the inside of the isolator module 40A. It is thereby possible to suppress degradation of a coupling coefficient of a transformer. The higher the coverage factor of the magnetic member 43A to the isolator module 40A is, the more the effect of suppressing an influence of the external magnetic flux φex can be increased.

3. Third Embodiment

Next, an isolator according to the third embodiment is described. The third embodiment differs from the first embodiment and the second embodiment in that a magnetic member is provided on an isolator package. Hereinafter, only the matters different from the first embodiment are described. Descriptions of configurations similar to those of the first embodiment are omitted.

FIG. 11 is a cross-sectional view, illustrating an example of a cross-sectional structure of an isolator according to the third embodiment. FIG. 11 corresponds to FIG. 2 to which reference was made in the first embodiment.

As shown in FIG. 11, the isolator package 1B comprises a frame 10, semiconductor chips 20 and 30, an isolator module 40, an insulating member 50, and a magnetic member 43B. Since the structures of the frame 10, the semiconductor chips 20 and 30, the isolator module 40, and the insulating member 50 are the same as those in the first embodiment, descriptions of the structures are omitted.

The magnetic member 43B is a plate-shaped member having magnetic properties. As the magnetic member 43B, a ferrite sheet may be used, for example. The magnetic member 43B is provided, overlapping the isolator module 40, when viewed in the Z direction. Specifically, the magnetic member 43B is provided, overlapping the primary coil and the secondary coil, when viewed in the Z direction. The magnetic member 43B may be provided on the upper surface of the insulating member 50.

According to the third embodiment, the magnetic member 43B is provided on the upper surface of the insulating member 50, in such a manner that the magnetic member overlaps the primary coil and the secondary coil in the isolator module 40 when viewed in the Z direction. It is thereby possible to prevent a magnetic flux generated when signals are transmitted and received via the isolator module 40 from extending beyond the magnetic member 43B and to the outside of the isolator package 1B. It is thus possible to improve a coupling coefficient of a transformer, similarly to the first embodiment.

4. Fourth Embodiment

Next, an isolator according to the fourth embodiment is described. The fourth embodiment differs from the third embodiment in that a magnetic member is provided to a surface other than the upper surface in addition to the upper surface of the isolator package. Hereinafter, only the matters different from the third embodiment are described. Descriptions of configurations similar to those of the third embodiment are omitted.

FIG. 12 is a cross-sectional view, illustrating an example of a cross-sectional structure of an isolator according to the fourth embodiment. FIG. 12 corresponds to FIG. 11 in the third embodiment.

As shown in FIG. 12, the isolator package 1C comprises a frame 10, semiconductor chips 20 and 30, an isolator module 40, an insulating member 50, and a magnetic member 43C. Since the structures of the frame 10, the semiconductor chips 20 and 30, the isolator module 40, and the insulating member 50 are the same as those in the third embodiment, descriptions of the structures are omitted.

The magnetic member 43C is a plate-shaped member having magnetic properties. As the magnetic member 43C, a ferrite sheet may be used, for example. The magnetic member 43C is provided so as to cover the upper, side, and lower surfaces of the insulating member 50. Specifically, the magnetic member 43C may be provided over the upper, side, and lower surfaces of the insulating member 50 in such a manner that the magnetic member 43C does not contact with the pins 24 and 34.

The magnetic member 43C may be a single continuous sheet or multiple sheets bonded together. As shown in the example of FIG. 12, it is desirable for the magnetic member 43C to completely cover the insulating member 50 except for the area that might interfere with the pins 24 and 34; however, the structure of the magnetic member 43C is not limited to this example. For example, in the case where the magnetic member 43C is made of multiple sheets bonded together, there may be a gap between these sheets. The magnetic member 43C is not necessarily provided on all surfaces of the insulating member 50. For example, the magnetic member 43C may be provided on at least one of the lower surface or the side surfaces in addition to the upper surface of the insulating member 50.

According to the fourth embodiment, the magnetic member 43C is provided so as to cover each surface of the isolator package 1C. It is thus possible to make a coupling coefficient of a transformer even better. It is thus possible to improve a coupling coefficient of a transformer, similarly to the third embodiment.

Furthermore, the magnetic member 43C can interrupt the external magnetic flux φex that flows from the outside of the isolator module 40A into the inside of the isolator package 1C. It is thereby possible to suppress degradation of a coupling coefficient of a transformer. The higher the coverage factor of the magnetic member 43C to the isolator package 1C is, the more the effect of suppressing an influence of the external magnetic flux φex can be increased.

5. Modifications, Etc

The foregoing first to fourth embodiments may be modified in various manners.

In the first to fourth embodiments, an example where a flexible printed circuit board made of a flexible substrate is used as a wiring board having a transformer is given; however, the wiring board is not limited to a flexible printed circuit board, and a rigid printed circuit board made of a rigid substrate may be used.

Each of the first to fourth embodiments explains an example where a coil used as a transformer has the figure-of-8 constituted by two spirally wound conductors; however, the embodiments are not limited to this example. The coil used as a transformer may be constituted by a single spirally wound conductor, or a coil in an arbitrarily selected shape.

In the third and fourth embodiments, the case where the isolator module 40 according to the first embodiment provided in the isolator packages 1B and 1C respectively is described; however, the configuration is not limited thereto. For example, the isolator module provided in the isolator packages 1B and 1C may be an isolator module 40A explained in the second embodiment or a structure to which no magnetic member is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:

an isolator module including a first coil and a second coil that are separated with respect to a first direction and face each other;

a magnetic member provided on the isolator module; and an insulating member covering the isolator module and the magnetic member; wherein the magnetic member includes:

a first part provided on one surface of upper and lower surfaces of the isolator module and overlapping the first coil and the second coil in the first direction, and a second part provided on a side surface of the isolator module and overlapping the first coil and the second coil in a second direction intersecting the first direction.

2. The isolator of claim 1, wherein
the magnetic member further includes a third part provided on another surface of the upper and lower surfaces of the isolator module and sandwiching the first coil and the second coil with the first part in the first direction.

3. The isolator of claim 1, wherein
the magnetic member covers the isolator module.

4. The isolator of claim 1, wherein
the magnetic member has a sheet shape and contains a ferrite.

5. The isolator of claim 1 further comprising:
a first chip;
a second chip;
a first wiring electrically coupling the first chip to the first coil; and
a second wiring electrically coupling the second chip to the second coil;
wherein the insulating member covers the first chip, the second chip, the first wiring, and the second wiring.

6. An isolator comprising:
an isolator module including a first coil and a second coil that are separated with respect to a first direction and face each other;
an insulating member covering the isolator module; and
a magnetic member provided on the insulating member, wherein
the magnetic member includes:
    a first part provided on one surface of upper and lower surfaces of the insulating member and overlapping the first coil and the second coil in the first direction, and
    a second part provided on a side surface of the insulating member and overlapping the first coil and the second coil in a second direction intersecting the first direction.

7. The isolator of claim 6, wherein
the magnetic member further includes a third part provided on another surface of the upper and lower surfaces of the isolator module and sandwiching the first coil and the second coil with the first part in the first direction.

8. The isolator of claim 6, wherein
the magnetic member covers the insulating member.

9. The isolator of claim 6, wherein
the magnetic member has a sheet shape and contains a ferrite.

10. The isolator of claim 6 further comprising:
a first chip;
a second chip;
a first wiring electrically coupling the first chip to the first coil; and
a second wiring electrically coupling the second chip to the second coil;

wherein the insulating member covers the first chip, the second chip, the first wiring, and the second wiring.

11. The isolator of claim 1, wherein
the isolator module further includes:
    a first wiring board provided with the first coil, and having a first pad and a first wiring, the first wiring electrically connected to and between the first coil and the first pad; and
    a second wiring board provided with the second coil, and having a second pad and a second wiring, the second wiring electrically connected to and between the second coil and the second pad,
an area of the second wiring board is smaller than an area of the first wiring board,
the first pad is provided on a first region, which is on an upper surface of the first wiring board, the first region not overlapped by the second wiring board in the first direction,
the second pad is provided on a second region, which is on an upper surface of the second wiring board, and
the magnetic member covers the isolator module excluding the first pad and the second pad.

12. An isolator comprising:
an isolator module including a first coil and a second coil that are separated with respect to a first direction and face each other;
a magnetic member provided on the isolator module in such a manner that the magnetic member overlaps the first coil and the second coil in the first direction; and
an insulating member covering the isolator module and the magnetic member;
wherein
the isolator module further includes:
    a first wiring board provided with the first coil, and having a first pad and a first wiring that is between and electrically connected to the first coil and the first pad; and
    a second wiring board provided with the second coil, and having a second pad and a second wiring that is between and electrically connected to the second coil and the second pad,
an area of the second wiring board is smaller than an area of the first wiring board,
the first pad is provided on a first region, which is on an upper surface of the first wiring board, the first region not overlapped by the second wiring board in the first direction,
the second pad is provided on a second region, which is on an upper surface of the second wiring board, and
the magnetic member covers the isolator module excluding the first pad and the second pad.

* * * * *